United States Patent
Lee et al.

(10) Patent No.: US 9,728,575 B1
(45) Date of Patent: Aug. 8, 2017

(54) PIXEL AND CIRCUIT DESIGN FOR IMAGE SENSORS WITH HOLE-BASED PHOTODIODES

(71) Applicant: SEMICONDUCTOR COMPONENTS INDUSTRIES, LLC, Phoenix, AZ (US)

(72) Inventors: Hong-Wei Lee, San Jose, CA (US); Jeffery Beck, Philomath, OR (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/161,485

(22) Filed: May 23, 2016

Related U.S. Application Data

(60) Provisional application No. 62/292,630, filed on Feb. 8, 2016.

(51) Int. Cl.
*H01L 27/146* (2006.01)

(52) U.S. Cl.
CPC .... *H01L 27/14643* (2013.01); *H01L 27/1462* (2013.01); *H01L 27/1469* (2013.01); *H01L 27/14616* (2013.01); *H01L 27/14634* (2013.01); *H01L 27/14636* (2013.01); *H01L 27/14685* (2013.01); *H01L 27/14689* (2013.01)

(58) Field of Classification Search
CPC ......... H01L 27/14647; H01L 27/14652; H01L 27/14643; H01L 27/14616; H01L 27/1462; H01L 27/14634; H01L 27/14636; H01L 27/14685; H01L 27/14689; H01L 27/1469
USPC ........................................................ 257/292
See application file for complete search history.

(56) References Cited

U.S. PATENT DOCUMENTS

| | | | |
|---|---|---|---|
| 5,625,210 A | 4/1997 | Lee et al. | |
| 5,705,807 A * | 1/1998 | Throngnumchai | ... G01J 1/4228 250/214 B |
| 8,664,734 B2 | 3/2014 | Wu et al. | |
| 2006/0157758 A1 * | 7/2006 | Rhodes | ............. H01L 27/14609 257/292 |
| 2006/0197169 A1 * | 9/2006 | Cole | ................. H01L 27/14623 257/431 |
| 2007/0069258 A1 * | 3/2007 | Ahn | .................. H01L 27/14634 257/290 |
| 2009/0200590 A1 * | 8/2009 | Mao | ..................... H01L 27/1463 257/292 |
| 2011/0096215 A1 * | 4/2011 | Choi | ................. H01L 27/14632 348/294 |

(Continued)

OTHER PUBLICATIONS

Hong, U.S. Appl. No. 14/877,722, filed Oct. 7, 2015.
Velichko et al., U.S. Appl. No. 14/836,599, filed Aug. 26, 2015.

*Primary Examiner* — Yasser A Abdelaziez
(74) *Attorney, Agent, or Firm* — Treyz Law Group, P.C.; Joseph F. Guihan

(57) ABSTRACT

In order to reduce dark current and pixel readout noise in an image sensor, pixels may include a p-type hole-based pinned photodiode. Charge stored in the p-type pinned photodiode may be transferred to a p-type floating diffusion (FD) node and read out by pixel circuitry that uses p-channel metal oxide-semiconductor field-effect transistors (p-channel MOSFET). Additionally, the pixel circuitry may be split across multiple wafers that are connected by metal interconnect layers. This arrangement may enable the pixel photodiode to have a larger size than if all of the pixel circuitry was in a single wafer.

14 Claims, 5 Drawing Sheets

(56) References Cited

U.S. PATENT DOCUMENTS

2012/0080733 A1* 4/2012 Doan ................ H01L 27/1463
257/292

* cited by examiner

PIXEL AND CIRCUIT DESIGN FOR IMAGE SENSORS WITH HOLE-BASED PHOTODIODES

CROSS-REFERENCE TO RELATED APPLICATION(S)

This application claims priority to U.S. Provisional Application No. 62/292,630, filed on Feb. 8, 2016, entitled "Pixel and Circuit Design for Image Sensors with Hole-Based Photodiodes," invented by Hong-Wei Lee and Jeffery Beck, and is incorporated herein by reference and priority thereto for common subject matter is hereby claimed.

BACKGROUND

This relates generally to imaging systems and, more particularly, to imaging systems that use hole-based photodiodes.

Modern electronic devices such as cellular telephones, cameras, and computers often use digital image sensors. Imager sensors (sometimes referred to as imagers) may be formed from a two-dimensional array of image sensing pixels. Each pixel includes a photosensitive element that receives incident photons (light) and converts the photons into electrical signals. Image sensors are sometimes designed to provide images to electronic devices using a Joint Photographic Experts Group (JPEG) format.

Image sensors may be complementary metal-oxide semiconductor (CMOS) image sensors. Conventional CMOS image sensors may include an n-type pinned photodiode to collect photoelectrons. Conventional CMOS image sensors may also use n-channel metal-oxide-semiconductor field-effect transistors (NMOS transistors). However, these conventional CMOS image sensors may experience high dark current and pixel readout noise.

It would therefore be desirable to be able to provide improved pixel designs for image sensors.

DETAILED DESCRIPTION

Embodiments of the present invention relate to image sensors with back-side illuminated pixels. In order to reduce dark current and pixel readout noise in the image sensor, pixels may include a p-type hole-based pinned photodiode. Charge stored in the p-type pinned photodiode may be transferred to a p-type floating diffusion (FD) node and read out by a pixel circuit that uses p-channel metal oxide-semiconductor field-effect transistors (sometimes referred to herein as PMOS transistors or p-channel MOSFET). Additionally, the pixel circuitry may be split across multiple wafers. This arrangement may enable the pixel photodiode to have a larger size than if all of the pixel circuitry was in a single wafer.

Figure 1:
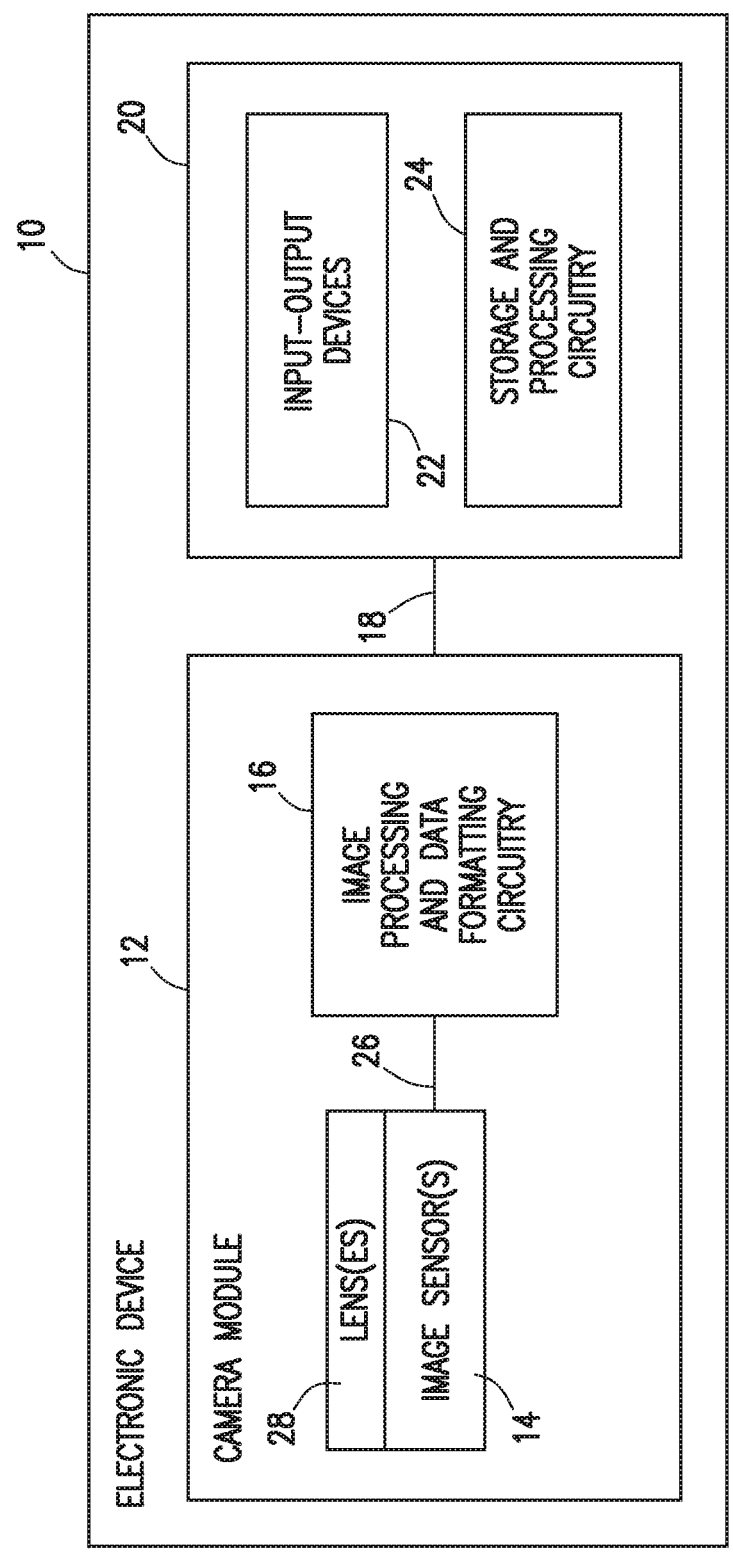
FIG. 1 is a schematic diagram of an illustrative electronic device with an image sensor in accordance with an embodiment of the present invention.

An electronic device with a digital camera module is shown in FIG. 1. Electronic device 10 may be a digital camera, a computer, a cellular telephone, a medical device, or other electronic device. Camera module 12 (sometimes referred to as an imaging device) may include image sensor 14 and one or more lenses 28. During operation, lenses 28 (sometimes referred to as optics 28) focus light onto image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry signal buffering circuits (e.g., source follower and load circuits), sample and hold circuitry, correlated double sampling (CDS) circuitry, amplifier circuitry, analog-to-digital (ADC) converter circuitry, data output circuitry, memory (e.g., data buffering circuitry), address circuitry, etc.

Still and video image data from image sensor 14 may be provided to image processing and data formatting circuitry 16 via path 26. Image processing and data formatting circuitry 16 may be used to perform image processing functions such as automatic focusing functions, depth sensing, data formatting, adjusting white balance and exposure, implementing video image stabilization, face detection, etc.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit chip. The use of a single integrated circuit chip to implement camera sensor 14 and image processing and data formatting circuitry 16 can help to reduce costs. This is, however, merely illustrative. If desired, camera sensor 14 and image processing and data formatting circuitry 16 may be implemented using separate integrated circuit chips.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

Figure 2:
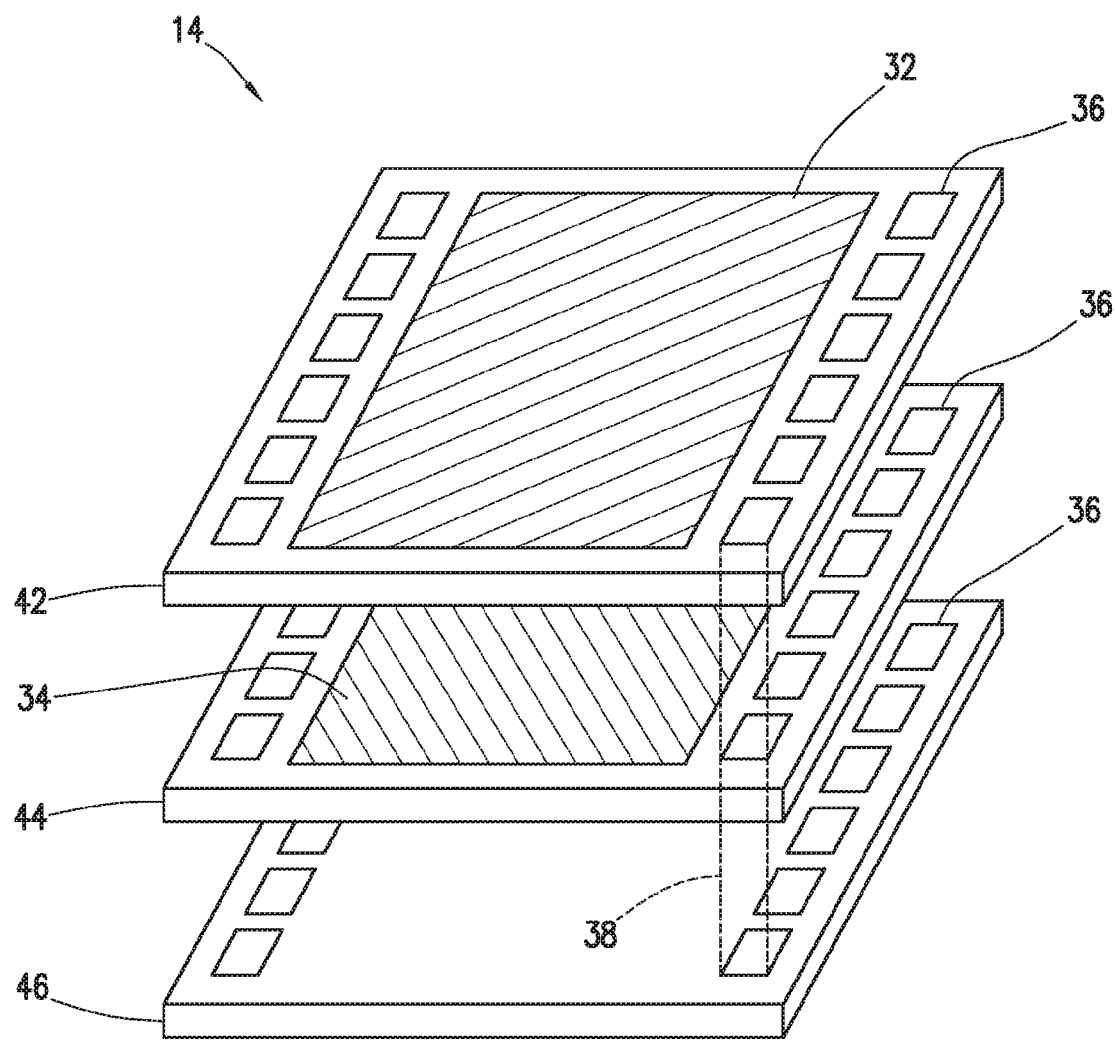
FIG. 2 is a perspective view of an illustrative image sensor with multiple substrates bonded together in accordance with an embodiment of the present invention.

FIG. 2 shows an illustrative image sensor such as image sensor 14 in FIG. 1. Image sensor 14 may sense light by converting impinging photons into electrons or holes that are integrated (collected) in sensor pixels. N-type photodiodes may convert impinging photons into electrons, while p-type photodiodes may convert impinging photons into holes.

After completion of the integration cycle, collected charge may be converted into a voltage, which may be supplied to the output terminals of image sensor 14. In embodiments where image sensor 14 is a complementary metal-oxide semiconductor (CMOS) image sensor, the charge to voltage conversion may be accomplished directly in the pixels of the image sensor. The analog pixel voltage may then be transferred to the output terminals through various pixel addressing and scanning schemes. The analog signal may also be converted on-chip to a digital equivalent before reaching the chip output. The pixels may have a source follower (SF), which may drive the sense lines that are connected to the pixels using suitable addressing transistors.

After charge to voltage conversion is completed and the resulting signal transferred out from the pixels, the pixels of image sensor 14 may be reset in order to be ready to accumulate new charge. In certain embodiments, pixels may use a floating diffusion region (FD) as a charge detection node. When a floating diffusion node is used, the reset may be accomplished by turning on a reset transistor that conductively connects the FD node to a voltage reference or a ground, which may be the pixel SF drain node. This step removes collected charge from the floating diffusion node.

Image sensor 14 may be formed with one or more substrate layers. The substrate layers may be layers of semiconductor material such as silicon. The substrate layers may be connected using metal interconnects. An example is shown in FIG. 2 in which substrates 42, 44, and 46 are used to form image sensor 14. Substrates 42, 44 and 46 may sometimes be referred to as chips or wafers. Upper wafer 42 may contain the pinned photodiodes in pixel array 32. Charge transferring transistors may also be included in upper wafer 42. However, to ensure that there is adequate room for the photodiodes in upper wafer 42, much of the pixel circuitry for the pixels may be formed in middle wafer 44 and lower wafer 46.

Middle wafer 44 may be bonded to upper wafer 42 with an interconnect layer at every pixel. For example, pixel circuitry 34 in middle wafer 44 may be bonded to a Floating Diffusion (FD) that is connected to a charge transfer transistor formed in upper wafer 42. Bonding each pixel in upper wafer 42 to corresponding pixel circuitry in middle wafer 44 (e.g., floating diffusion to floating diffusion) may be referred to as hybrid bonding. Middle wafer 44 and lower wafer 46 may not be coupled with hybrid bonding. Only peripheral electrical contact pads 36 of each wafer may be bonded together (e.g., chip-to-chip connections 38). Each wafer in image sensor 14 may include relevant circuitry. The upper wafer may contain pinned photodiodes and charge transferring transistors. The middle wafer may include pixel circuitry (e.g., floating diffusion node, source follower transistor, reset transistor etc.). The bottom wafer may include one or more of clock generating circuits, pixel addressing circuits, signal processing circuits such as the CDS circuits, analog to digital converter circuits, digital image processing circuits, and system interface circuits.

Figure 3:
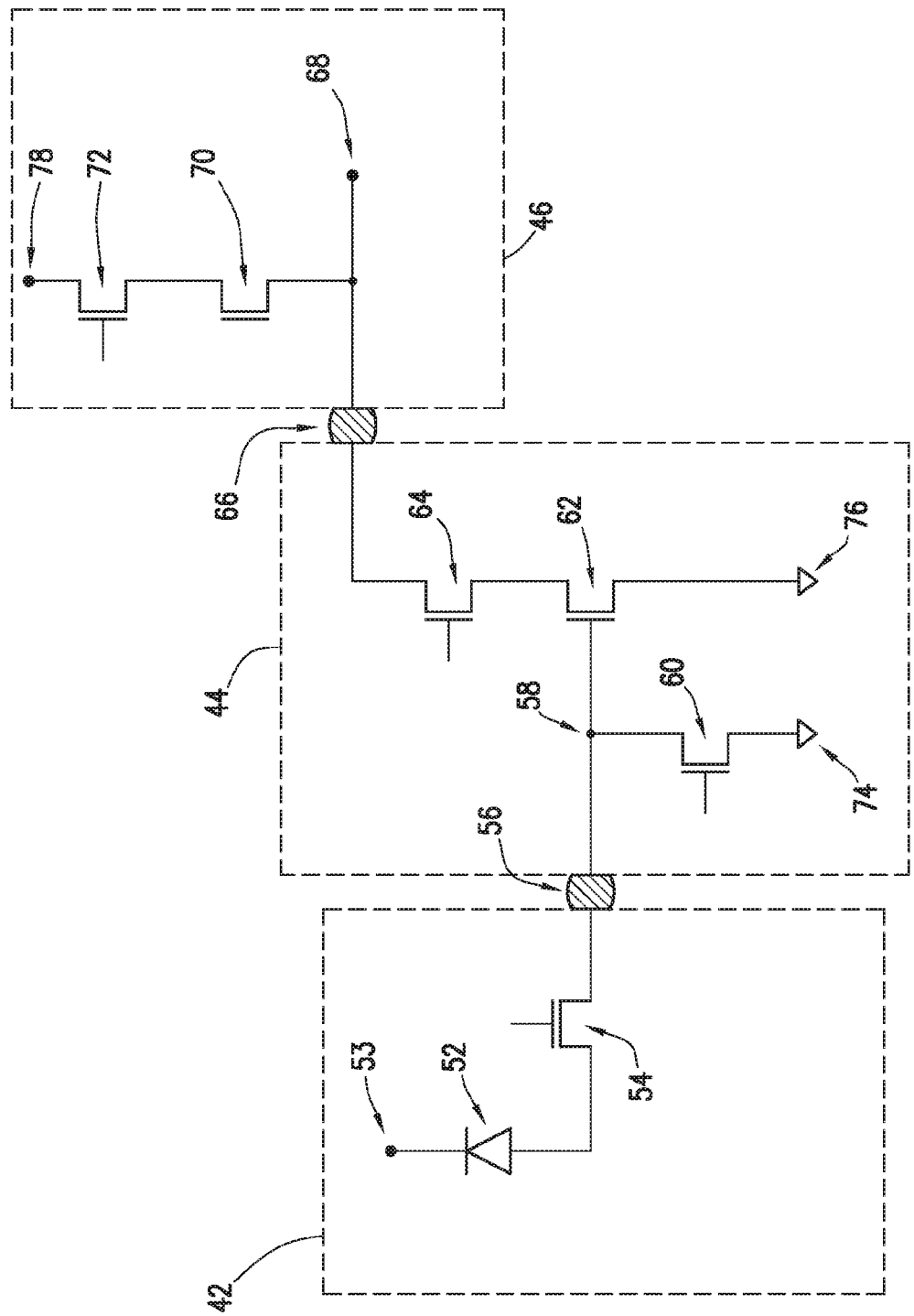
FIG. 3 is a circuit diagram of an illustrative pixel with a p-type photodiode and PMOS transistors in accordance with an embodiment of the present invention.

FIG. 3 is a diagram of an illustrative image pixel with multiple substrate layers connected by interconnect layers. As shown in FIG. 3, substrate 42 may contain photodiode 52 and transfer transistor 54. Photodiode 52 may be a p-type hole-based photodiode. Photodiode 52 may be coupled to positive potential 53. The photodiode may also include a shallow n-type pinning implant to pin the photodiode. Upper wafer 42 may also include transfer transistor 54. Transfer transistor 54 may transfer charge from photodiode 52 to floating diffusion 58 when asserted.

An interconnect layer may be used to connect upper substrate layer 42 to middle substrate layer 44. Interconnect layer 56 may be formed from a conductive material such as metal (e.g., copper). In certain embodiments, the interconnect layer may include solder. The interconnect layer may also be a through silicon via (TSV).

Substrates 42 and 44 may contain floating diffusion regions. Floating diffusion region 58 may be a lightly p-type doped floating diffusion region. Using light doping to form the floating diffusion may reduce damage to the wafer. Reduced damage to the wafer may reduce leakage from the floating diffusion and improve conversion gain of the pixel. A first lightly p-type doped floating diffusion region may be formed in upper wafer 42. An additional lightly p-type doped floating diffusion region may be included in middle wafer 44. The floating diffusion in upper wafer 42 may be electrically connected to the floating diffusion in middle wafer 44. Both floating diffusions may have a p+ doped region within the floating diffusion region. For simplicity, FIG. 3 only has the floating diffusion in the middle wafer labeled.

Middle wafer 44 also may include a reset transistor 60. Reset transistor may couple floating diffusion 58 to ground 74 when asserted. This clears floating diffusion 58 of accumulated charge. Middle wafer 44 may also include source follower transistor 62. Source follower transistor may be coupled to ground 76 and row select transistor 64. If desired, source follower transistor 62 and reset transistor 60 may both be coupled to the same ground. Reset transistor 60, source follower transistor 62, and row select transistor 64 may all be p-channel MOSFET. Source follower transistor 62 may be a buried channel or surface channel transistor.

An interconnect layer may be used to connect middle substrate layer 44 to lower substrate layer 46. Interconnect layer 66 may be formed from a conductive material such as metal (e.g., copper). In certain embodiments, the interconnect layer may include solder. The interconnect layer may also be a through silicon via (TSV).

Lower wafer 46 may include at least one circuit associated with the pixel (e.g., clock generating circuits, pixel addressing circuits, CDS circuits, analog to digital converter circuits, image processing circuits, and system interface circuits). Pixel output line 68 may provide the signal from the pixel to various processing circuits. Lower wafer 46 may also include positive potential 78 and current source transistor 72 for the pixel circuit. Select transistor 70 may be interposed between the current source and row select transistor 64. However, select transistor 70 may not be included in the circuit if desired. Positive potential 78 may be the same potential as positive potential 53 or a different potential than positive potential 53.

In the embodiment where transistors 60, 62, and 64 are PMOS transistors, current source 72 may be referred to as a PMOS current source. The current source for PMOS transistors may be lower than the requisite current source if transistors 60, 62, and 64 were NMOS transistors. Using PMOS transistors instead of NMOS transistors therefore enables use of a lower current source which results in lower power consumption and less noise. The lower current source also may reduce dark current and the temperature of the wafers. Using PMOS transistors also improves the readout noise floor when compared to NMOS transistors. A PMOS source follower transistor has less readout noise than a NMOS source follower transistor.

The arrangement of FIG. 3 offers numerous other improvements compared to conventional CMOS image sensors. The p-type photodiode significantly reduces dark current. Additionally, shallow trench isolation (STI) is not necessary in the embodiments of the present invention. The absence of STI has additional dark current improvements compared to conventional image sensors. The pixel of FIG. 3 also has low leakage from the floating diffusion region due to limited silicon defects from the shallow lightly doped floating diffusion. Capacitance of the floating diffusion may also be reduced, which may increase conversion gain.

Splitting the pixel circuitry between three wafers also has a number of advantages. First, the photodiode can be larger than if only one wafer was used. This increases full well capacity and quantum efficiency of the pixels. The performance of each wafer may also be optimized individually.

Although not shown in FIG. 3, additional components may be incorporated into the pixel. For example, storage diodes or storage capacitors may be included for global shutter or high dynamic range applications. If desired, the pixel may be provided with an additional transistor used to implement a dual conversion gain mode. The additional transistor may be coupled to a capacitor. When the additional transistor is turned on, the capacitor may be switched into use to provide floating diffusion FD with additional capacitance. This results in lower conversion gain for the pixel. When the additional transistor is turned off, the additional loading of the capacitor is removed and the pixel reverts to a relatively higher pixel conversion gain configuration.

In the example of FIG. 3, transfer transistor 54 was depicted as being formed in upper wafer 42 while reset transistor 60, source follower transistor 62, and row select transistor 64 were depicted as being formed in the middle wafer 44. It should be noted that this example is merely illustrative, and the transistors may be formed in other wafers if desired. For example, reset transistor 60 and/or source follower transistor 62 may be formed in upper wafer 42 instead of middle wafer 44.

Figure 4:
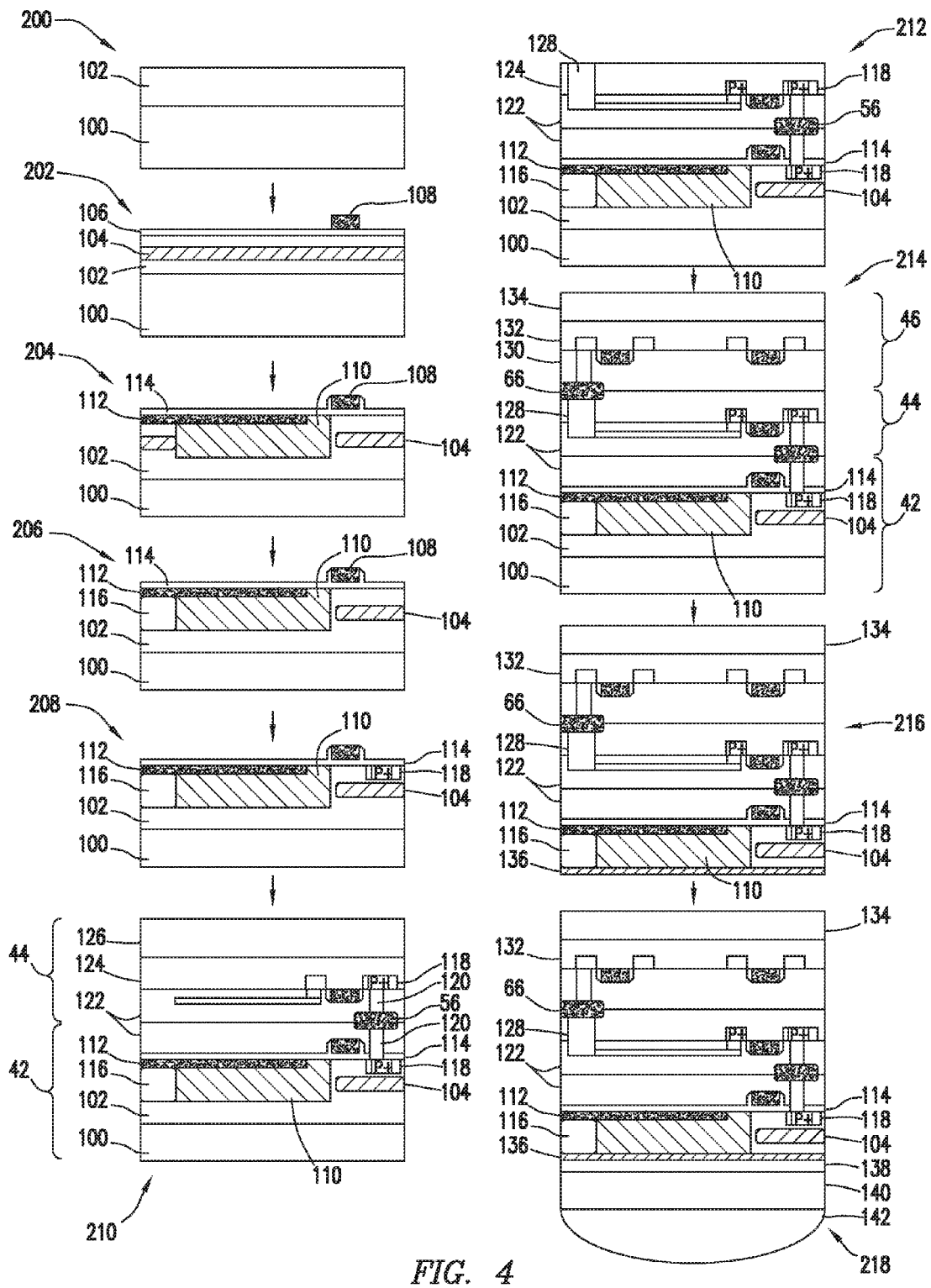
FIG. 4 is a flowchart showing an illustrative method of forming an image sensor of the type shown in FIGS. 2 and 3 in accordance with an embodiment of the present invention.

FIG. 4 shows an illustrative method for forming an image sensor of the type shown in FIGS. 2 and 3. At step 200, substrate 100 may be provided. Substrate 100 may be a p-type doped silicon substrate. Also at step 200, n-type epitaxial silicon 102 may be grown on substrate 100. At step 202, channel stop layer 104 may be implanted in n-type epitaxial silicon 102. Sacrificial oxide 106 may also be grown, and polysilicon may be patterned to form transfer gate 108. At step 204, a dopant may be implanted into the n-type epitaxial silicon to form photodiode 110. Photodiode 110 may be a p-type photodiode doped with boron. Other dopants may be used if desired. Also at step 204, spacer 114 may be deposited and n-type pinning layer 112 may be formed. Pinning layer 112 may be a n+ pinning layer formed from arsenic implants or other desired n-type dopants. At step 206, n-well implants 116 may be formed to isolate adjacent photodiodes from each other. At step 208, floating diffusion 118 may be formed. Floating diffusion 118 may be formed with a lightly doped p-type implant. A localized p+ implant may be formed within the lightly doped p-type implant.

At step 210, wafer 42 may be provided with a via 120 through dielectric layer 122. An additional wafer 44 may also be provided. Wafer 44 may have a dielectric layer 122, n-well 124, and p-type substrate 126. Wafer 44 may have a floating diffusion 118 formed in n-well 124. The floating diffusion in wafer 44 may be formed the same way as the floating diffusion in wafer 42. Wafers 42 and 44 may be coupled with interconnect 56. Interconnect 56 may be a hybrid bond. Vias 120 may contact various interconnect layers, including interconnect layer 56, as well as the p+ doped regions of the floating diffusion regions 118. At step 212, wafer 44 may be thinned using chemical mechanical polishing (CMP) and a chemical wet etch. Other thinning processes may be used if desired. Thinning wafer 44 may result in substrate 126 being completely removed. Also at step 212, through-silicon via (TSV) 128 may be formed. The TSV may be filled with copper or another metal.

At step 214, an additional wafer 46 may be provided. Wafer 46 may have a dielectric layer 130, a layer of p-type epitaxial silicon 132, and a p-type substrate 134. Wafer 46 may be coupled to wafer 44 with interconnect 66. At step 216, wafer 42 may be thinned using CMP combined with chemical wet etch or another desired thinning process. Wafer 42 may be thinned such that substrate 100 is entirely removed. A portion of n-type epitaxial silicon 102 may also be removed during the thinning process.

After thinning the wafer, a passivation layer 136 may be formed on wafer 42. Passivation layer 136 is formed at the back side of wafer 42 adjacent to photodiode 110. Passivation layer 136 may be formed using any desired techniques. In one illustrative embodiment, passivation layer 136 may be formed by implanting a shallow n-type layer in the back side of the wafer followed by laser annealing. In another embodiment, passivation layer 136 may be formed by depositing a positive charged film on the back side of the wafer to repel holes from the back side surface. In yet another embodiment, passivation layer 136 may be formed by implanting deep n-type dopant through the front side of wafer 42 during front end of the line (FEOL) processing. The n-type dopant may be thermally activated during FEOL processing. Passivation layer 136 may reduce dark current in the pixel. At step 218, an anti-reflection coating 138, color filter 140, and microlens 142 may be formed over the pixel.

Figure 5:
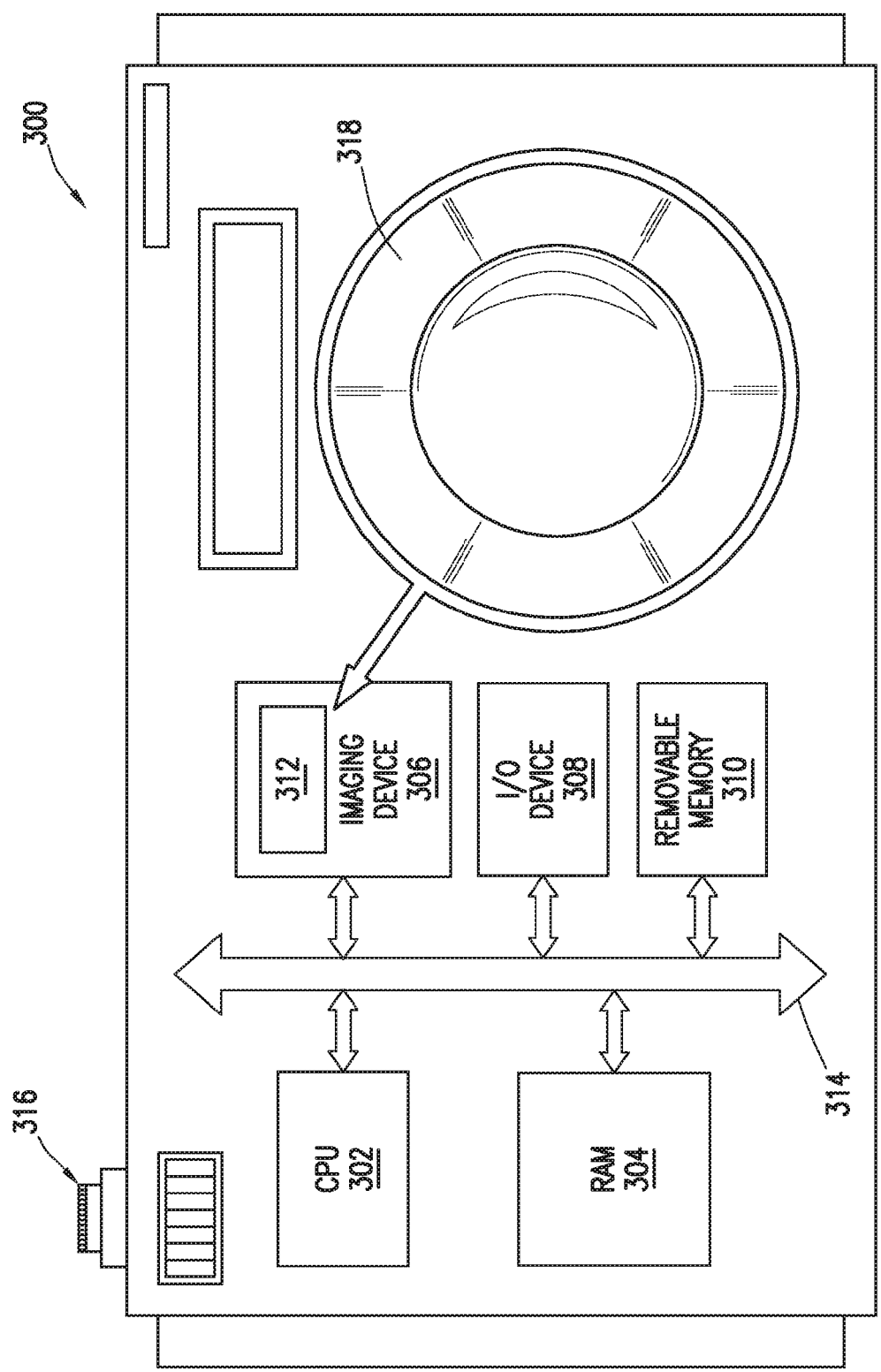
FIG. 5 is a block diagram of a processor system employing the embodiments of FIGS. 1-4 in accordance with an embodiment of the present invention.

FIG. 5 shows in simplified form a typical processor system 300, such as a digital camera, which includes an imaging device 306. Imaging device 306 may include a pixel array 312 with pixels of the type shown in FIG. 3. Processor system 300 is exemplary of a system having digital circuits that may include imaging device 306. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 318 for focusing an image onto a pixel array such as pixel array 312 when shutter release button 316 is pressed. Processor system 300 may include a central processing unit such as central processing unit (CPU) 302. CPU 302 may be a microprocessor that controls camera functions and one or more image flow functions and communicates with one or more input/output (I/O) devices 308 over a bus such as bus 314. Imaging device 306 may also communicate with CPU 302 over bus 314. System 300 may include random access memory (RAM) 304 and removable memory 310. Removable memory 310 may include flash memory that communicates with CPU 302 over bus 314. Imaging device 306 may be combined with CPU 302, with or without memory storage, on a single integrated circuit or on a different chip. Although bus 314 is illustrated as a single bus, it may be one or more buses or bridges or other communication paths used to interconnect the system components.

In various embodiments of the invention, an imaging pixel array may include a first substrate layer, a second substrate layer, a p-type photodiode formed in the first substrate layer, a source follower transistor formed in the second substrate layer, and an interconnect layer that couples the first substrate layer to the second substrate layer. The source follower transistor may be a p-channel metal-oxide-semiconductor field-effect transistor. The imaging pixel array may also include a transfer transistor formed in the first substrate layer and a reset transistor formed in the second substrate layer. The reset transistor may be a p-channel metal-oxide-semiconductor field-effect transistor. The imaging pixel array may also include a row select transistor formed in the second substrate layer. The row select transistor may be a p-channel metal-oxide-semiconductor field-effect transistor.

The interconnect layer may include metal. The imaging pixel array may also include a floating diffusion region formed in the first substrate layer. The floating diffusion region may include a lightly doped p-type floating diffusion region. The imaging pixel array may also include an additional floating diffusion region formed in the second substrate layer. The additional floating diffusion region may include a lightly doped p-type floating diffusion region. The interconnect layer may be interposed between the floating diffusion region and the additional floating diffusion region. The imaging pixel array may also include a third substrate layer. The third substrate layer may include a circuit selected from the group consisting of: a clock generating circuit, a pixel addressing circuit, a signal processing circuit, an analog to digital converter circuit, a digital image processing circuit, and a system interface circuit. The imaging pixel array may also include an additional interconnect layer that couples the second substrate layer to the third substrate layer.

In various embodiments, a system may include a central processing unit, memory, input-output circuitry, and an imaging device. The imaging device may include an image sensor having an array of image pixels. The image sensor may include an upper wafer, a middle wafer, a lower wafer with at least one processing circuit, a first interconnect layer that couples the upper wafer to the middle wafer, and a second interconnect layer that couples the middle wafer to the lower wafer. The upper wafer may include an array of p-type pinned photodiodes. The middle wafer may include a source follower transistor that is a p-channel metal-oxide-semiconductor field-effect transistor. The middle wafer may have a through-silicon via that is coupled to the second interconnect layer. The middle wafer may also include a reset transistor and a row select transistor. The reset transistor and the row select transistor may both be p-channel metal-oxide-semiconductor field-effect transistors. The system may also include a passivation layer formed on the back side of the upper wafer. The passivation layer may include n-type implants in the upper wafer or a positively charged thin film.

In various embodiments, a method for forming an imaging pixel array may include implanting a p-type dopant into a first wafer to form a p-type photodiode, implanting an n-type dopant into the first wafer to form an n-type pinning layer, forming a lightly doped p-type floating diffusion region in the first wafer, forming a p+ doped region within the floating diffusion region, and attaching a second wafer to the first wafer using an interconnect layer. A metal via may couple the p+ doped region within the floating diffusion region to the interconnect layer, and the second wafer may include a source follower transistor that is a p-channel metal-oxide-semiconductor field-effect transistor. The method may also include forming a passivation layer on a back side of the first wafer. Forming the passivation layer may include either implanting a shallow n-type layer into the back side of the first wafer and laser annealing the shallow n-type layer, implanting a deep n-type layer into the front side of the first wafer and thermally activating the deep n-type layer, or depositing a positively charged thin-film on the back side of the first wafer.

The foregoing is merely illustrative of the principles of this invention and various modifications can be made by those skilled in the art without departing from the scope and spirit of the invention.

What is claimed is:

1. An imaging pixel array comprising:
   a first substrate layer;
   a second substrate layer;
   a p-type photodiode formed in the first substrate layer;
   a source follower transistor, wherein the source follower transistor is a p-channel metal-oxide-semiconductor field-effect transistor;
   an interconnect layer that couples the first substrate layer to the second substrate layer;
   a floating diffusion region formed in the first substrate layer, wherein the floating diffusion region comprises a lightly doped p-type floating diffusion region; and
   a third substrate layer, wherein the third substrate layer includes one or more circuits selected from the group consisting of: a clock generating circuit, a pixel addressing circuit, a signal processing circuit, an analog to digital converter circuit, a digital image processing circuit, and a system interface circuit.

2. The imaging pixel array defined in claim 1, further comprising:
   an additional interconnect layer that couples the second substrate layer to the third substrate layer.

3. An imaging pixel array comprising:
   a first substrate layer;
   a second substrate layer;
   a p-type photodiode formed in the first substrate layer;
   a source follower transistor, wherein the source follower transistor is a p-channel metal-oxide-semiconductor field-effect transistor;
   an interconnect layer that couples the first substrate layer to the second substrate layer; and
   a passivation layer formed on the back side of the first substrate layer, wherein the passivation layer comprises a passivation layer selected from the group consisting of: n-type implants in the first substrate layer and a positively charged thin film.

4. The imaging pixel array defined in claim 3, wherein the passivation layer comprises the n-type implants in the first substrate layer.

5. The imaging pixel array defined in claim 3, wherein the passivation layer comprises the positively charged thin film.

6. The imaging pixel array defined in claim 3, further comprising a color filter layer and an anti-reflection coating, wherein the anti-reflection coating is interposed between the passivation layer and the color filter layer.

7. The imaging pixel array defined in claim 1, further comprising:
   a transfer transistor formed in the first substrate layer.

8. The imaging pixel array defined in claim 7, further comprising:
   a reset transistor formed in the second substrate layer, wherein the reset transistor is a p-channel metal-oxide-semiconductor field-effect transistor.

9. The imaging pixel array defined in claim 8, further comprising:

a row select transistor formed in the second substrate layer, wherein the row select transistor is a p-channel metal-oxide-semiconductor field-effect transistor.

10. The imaging pixel array defined in claim 1, wherein the interconnect layer comprises metal.

11. The imaging pixel array defined in claim 10, further comprising:
an additional floating diffusion region formed in the second substrate layer, wherein the additional floating diffusion region comprises a lightly doped p-type floating diffusion region.

12. The imaging pixel array defined in claim 11, wherein the interconnect layer is interposed between the floating diffusion region and the additional floating diffusion region.

13. The imaging pixel array defined in claim 1, further comprising:
an n-type doped pinning layer adjacent to the p-type photodiode.

14. The imaging pixel array defined in claim 1, wherein the source follower transistor is formed in the second substrate layer.

* * * * *